Figure 1:
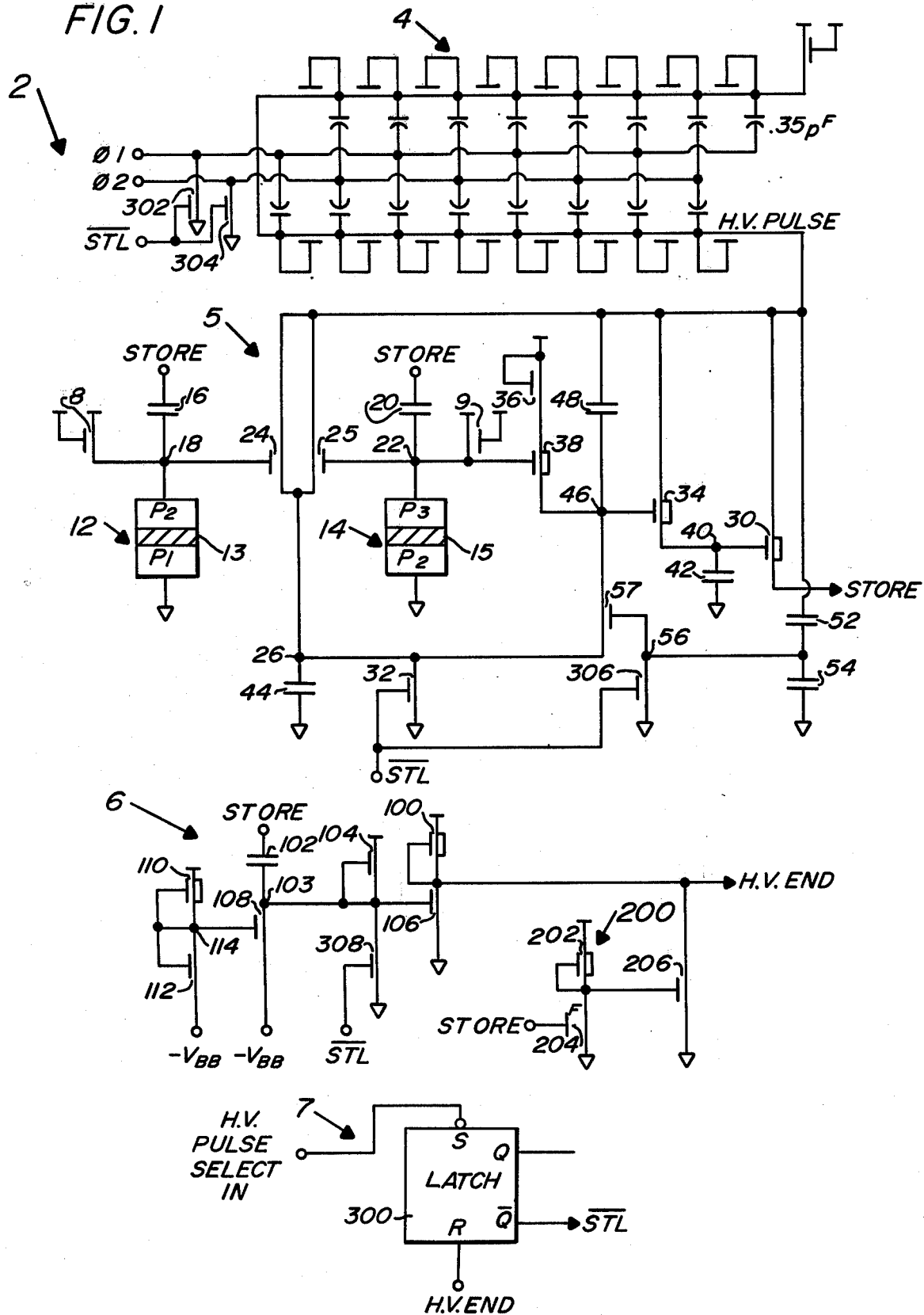

United States Patent [19]

Drori et al.

[11] 4,404,475

[45] Sep. 13, 1983

[54] INTEGRATED CIRCUIT HIGH VOLTAGE PULSE GENERATOR SYSTEM

[75] Inventors: Joseph Drori, San Jose; William H. Owen, III, Mountain View; Richard T. Simko, Los Altos, all of Calif.

[73] Assignee: Xicor, Inc., Milpitas, Calif.

[21] Appl. No.: 252,231

[22] Filed: Apr. 8, 1981

[51] Int. Cl.³ .......................... H03K 3/45; H03K 3/01; H03L 5/00

[52] U.S. Cl. .................................... 307/264; 307/268; 307/296 A; 365/185

[58] Field of Search ............... 307/228, 264, 268, 270, 307/296 A, 555, 303; 365/185

[56] References Cited

U.S. PATENT DOCUMENTS 4,181,980 1/1980 McCoy ................................ 365/185

Primary Examiner—John Zazworsky
Attorney, Agent, or Firm—Fitch, Even, Tabin & Flannery

[57] ABSTRACT

An integrated circuit system for generating a regulated high voltage tunneling pulse whose voltage level varies as a function of the voltage level needed to initiate tunneling of electrons across one or more dielectric gaps between respective first and second regions. The voltage level of initial electron tunneling is compared with a predetermined voltage margin so as to cause said generated tunneling voltage pulse to have a voltage level equal to the sum of said detected tunneling voltage and said voltage margin. The tunneling voltage pulse is then maintained substantially at this level for a predetermined duration before the tunneling pulse is discharged.

16 Claims, 2 Drawing Figures

INTEGRATED CIRCUIT HIGH VOLTAGE PULSE GENERATOR SYSTEM

This application is related to co-pending application Ser. No. 71,498, filed on Aug. 31, 1979, now U.S. Pat. No. 4,326,134, issued Apr. 20, 1982, entitled "Integrated Rise Time Regulated Voltage Generator Systems."

The present invention relates generally to the field of logic level interfaced, high voltage pulse generator integrated circuit systems, and more particularly relates to such systems wherein the amplitude of a high voltage pulse is controlled by a reference voltage whose amplitude reflects the minimum voltage level needed to cause electron tunneling to begin across a dielectric gap between a first region and a second region. The present invention further relates to such systems wherein the amplitude of said high voltage pulse is caused to remain substantially constant for a predetermined period of time after this tunneling voltage level has been reached. Such integrated circuit high voltage pulse generator systems are particularly adapted for operation of nonvolatile integrated memory systems incorporating integrated floating gate circuit elements for information storage as an electrical charge condition of the floating gate elements.

Many nonvolatile memory circuits have been developed in the last few years. See e.g., E. Harari, et al., "A 256-Bit Nonvolatile Static RAM", 1978 IEEE International Solid State Circuits Conference Digest, pp. 108–109; D. Frohmann, "A Fully-Decoded 2048-Bit Electrically Programmable MOS-ROM", 1971 IEEE International Solid State Circuits Conference Digest, pp. 80–81; U.S. Pat. No. 3,660,819; U.S. Pat. No. 4,099,196; and U.S. Pat. No. 3,500,142. Such circuits generally involve the use of an electron tunneling mechanism which is enabled across a dielectric gap, formed with silicon dioxide for example, between two regions. Generally, this electron tunneling is caused to occur through the application of a relatively high voltage pulse, at least as compared to the voltage potential of conventional logic level signals existing in the circuit. Such tunneling structures have been used to produce various devices including nonvolatile random access memories (NOVRAM's) and electrically erasable read only memories (EEPROM's or E$^2$ROM's). To realize these nonvolatile electrically erasable devices, generally either floating gate structures or metal-nitride-oxide-semiconductor (MNOS) tunneling structures are used.

A floating gate is an island of conducting material, electrically insulated from all other conductors. Various means have been proposed for introducing and removing a signal charge from the floating gate. Once the charge is on the gate, it remains permanently trapped, because the floating gate is completely surrounded by an insulating material which acts as a barrier to the discharging of the floating gate. The charge is introduced onto or removed from the floating gate by tunneling the charge across an oxide dielectric gap from an adjacent region such as a gate electrode. The present charge state of the floating gate may be conventionally sensed by means of an MOS transistor wherein the floating gate forms the gate of the transistor. This transistor will be rendered conductive or nonconductive depending on the charge state of the floating gate, thereby forming the basis for memory device storage of binary "1" or "0" data.

MNOS devices also require that electrons tunnel across a dielectric gap such as a thin tunnel oxide from a first region to a second region, for example, from a substrate to a silicon nitride interface, with the charge stored in charge traps formed within the nitride dielectric. The characteristic drawback of all such electrically alterable nonvolatile memories is that the number of times or cycles in which charge can be tunneled across the dielectric is limited. It has been found that a dielectric, such as silicon dioxide, when used for tunneling, has a lifetime associated with the absolute amount of charge that passes through the dielectric. Apparently, a certain number of electrons tend to get trapped in the oxide during each tunneling cycle, with the net effect being that the voltage required to initiate electron tunneling across the dielectric for a particular current level begins to rise. The margin of effective tunneling as a result is decreased, such that after a certain amount of additional cycles, tunneling is no longer possible across the dielectric. Thus, to maintain tunneling, the high voltage needed to generate tunneling must be increased to compensate for this diminished field strength. See, e.g. W. S. Johnson et al., "A 16-Kb Electrically Erasable Nonvolatile Memory", 1980 IEEE International Solid State Circuits Conference, pp. 152–153; and J. Kupec et al, "Triple Level Polysilicon E$^2$PROM With Single Transistor Per Bit", 1980 IEEE International Electron Devices Conference, pp. 602–606. No prior art device is known wherein the high voltage pulse needed to generate electron tunneling is varied by the integrated circuit in such a manner so as to compensate for this degradation in the ability of electrons to tunnel.

It has also been found that the retention characteristics of a given cell are dependent on the level of the applied tunneling voltage. If an amount of charge is coupled to a storage medium, such as a floating gate, that is less than what is normally required, the probability that this charge will be retained over a fixed period of time is less. See, e.g., K. Uchiumi et al, "16-K EEPROM Keeps MNOS in the Running", Electronics, Feb. 24, 1981, pp. 154–156. This degradation in the retention characteristics obviously becomes more significant as the tunneling mechanism deteriorates over time with increasing numbers of tunneling cycles.

Finally, prior art memory devices have generally obtained the high voltage pulse needed to induce tunneling across an oxide or other dielectric gap from an external voltage source, and this voltage has generally been a fixed voltage over time. In the above identified co-pending application, Ser. No. 71,498, a high voltage generator circuit was disclosed wherein the high voltage generator was part of the integrated circuit chip, and was powered from a standard logic level voltage of +5 volts. Integrated circuitry was also disclosed for regulating the rise time of the high voltage pulse generated by this circuit. The present invention is directed toward regulating the amplitude of such a high voltage pulse which is again preferably generated from a generator integrated as part of the circuit. However, it is also envisioned that only the regulator portion of the circuit need be on the integrated circuit chip, with the initial high voltage pulse generated externally thereto.

Therefore, an object of the present invention is to provide an integrated circuit high voltage pulse generator system that compensates for degradation in the tunneling field in a dielectric between two regions by providing a tunneling voltage that increases in amplitude as needed, while preventing this tunneling voltage from overdriving the dielectric.

Another object of the present invention is to provide an integrated circuit high voltage pulse generator system that provides a voltage margin above the minimum voltage necessary to induce tunneling across a dielectric, to thereby insure that sufficient charge is coupled to the floating gate or other storage media to maximize the retention characteristics of the storage media.

Still another object of the present invention is to provide an integrated circuit high voltage pulse generator system wherein a plurality of exemplary tunneling elements are sensed and compared with one another, and the output high voltage tunneling pulse amplitude adjusted to compensate for the worst case tunneling level sensed from said tunneling elements.

Yet another object of the present invention is to provide means for maintaining the output high voltage pulse substantially at the voltage level determined to be needed for proper tunneling for a predetermined period of time after the output voltage pulse has reached this voltage level, to enable a maximum amount of charge to be tunneled without overstressing the tunneling dielectric with a higher voltage.

Still another object of the present invention is to provide an integrated circuit high voltage pulse generator system designed to sense the end of a tunneling cycle and to reset the generator system in response thereto.

Figure 2:
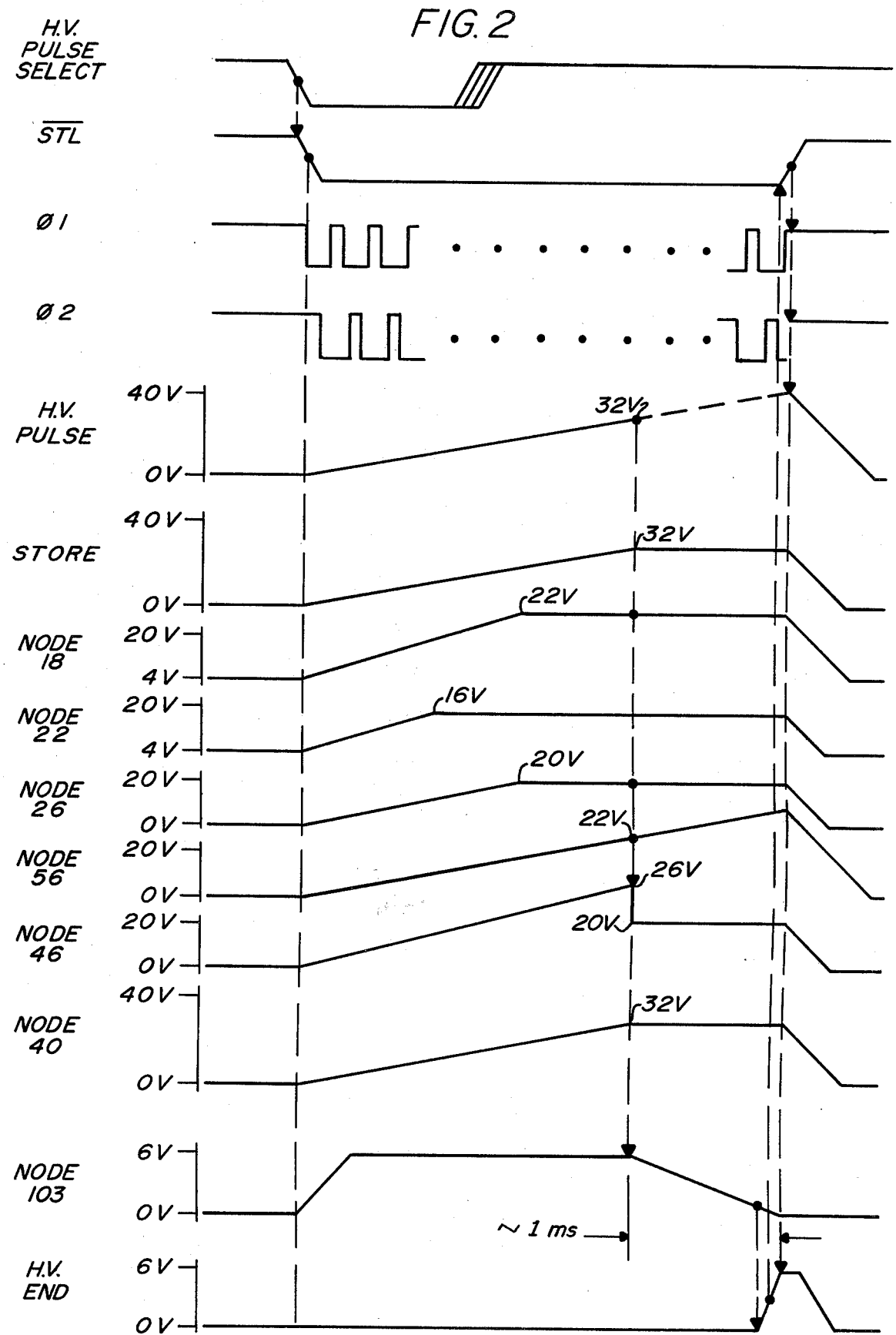

These and other objects and advantages of the present invention will become more apparent from the following detailed description and accompanying drawings in which:

FIG. 1 is a circuit schematic of a preferred embodiment of a logic level interfaced regulated integrated circuit high voltage pulse generator circuit according to the present invention; and FIG. 2 illustrates the circuit timing operation of the embodiment of the present invention shown in FIG. 1.

Generally, the present invention is directed to methods and apparatus for generating high voltage pulse signals for inducing electron tunneling across one or more dielectric gaps between respective first and second regions, and includes means for generating an output voltage pulse whose amplitude is substantially equal to an input voltage of substantially constantly increasing amplitude so long as electron tunneling has not been induced by said output voltage pulse across a dielectric gap from a first region to a second region, and whose amplitude is limited to a voltage level independent of the voltage level of said input voltage once said electron tunneling has been induced. In other words, the present invention includes means responsive to a first voltage pulse of increasing magnitude for generating an output voltage signal of substantially the same amplitude, said voltage signal being coupled out to one or more nonvolatile memory cells in an integrated circuit memory array. Also included are means for capacitively coupling this output voltage pulse across a tunneling element, comprising a dielectric gap between a first region and a second region, designed to exemplify the tunneling operation occuring in each memory cell, and means for sensing when this output voltage pulse has reached a minimum voltage level so as to cause electron tunneling to begin across said dielectric gap. Finally, means responsive to said sensing means are provided for generating a reference voltage whose voltage reflects said output voltage pulse voltage level after said tunneling has begun, and means responsive to the generation of said reference voltage for limiting said output voltage pulse to a predetermined voltage amplitude with respect to said reference voltage amplitude.

The high voltage pulse generator circuit further includes means for insuring that a voltage margin above the minimum required to induce electron tunneling is included in the amplitude of the output voltage pulse, and means for maintaining this pulse amplitude for a predetermined length of time after said amplitude has been reached.

Turning now to the drawings, a preferred embodiment of a high voltage pulse generator circuit according to the present invention is shown at 2 in FIG. 1. The regulated high voltage output STORE pulse is shown as being output by the circuit 2 and is particularly adapted for use in a nonvolatile memory integrated circuit as described in co-pending application Ser. No. 71,499, now U.S. Pat. No. 4,326,134, issued Apr. 20, 1982, entitled "Nonvolatile Static Access Memory System", which is incorporated by reference herein. The circuit 2 may include a charge pump section 4 for generation of an initial high voltage pulse (HV PULSE). In the present embodiment, the HV PULSE is a voltage of increasing magnitude whose absolute magnitude is a function of the number of stages in the charge pump and the magnitude and frequency of the $\Phi 1$, and $\Phi 2$ clock inputs to the pump. Other high voltage generators are also within the scope of the present invention. Circuit 2 also includes a regulator circuit 5, which functions to sense the minimum voltage needed to induce electron tunneling, across a dielectric, to generate a voltage margin above this minimum voltage level, and to limit the output STORE pulse to a voltage level that is a function of the sum of these two levels. A so-called "flat top" generator circuit 6 functions to enable the STORE pulse to be maintained at a substantially constant amplitude once it reaches the above described voltage limit. Finally, circuit 7 illustrates exemplary operation of the means by which the high voltage pulse generator circuit 2 according to the present invention is caused to begin operation and thereafter to reset at the end of the voltage generating cycle.

As seen in FIG. 1, the present invention may include one or more tunneling elements as shown at 12 and 14. These tunneling elements, in general, are preferably designed to be characteristic of tunneling devices used in the integrated circuit in which the STORE pulse is being coupled for generation of electron tunneling in such cells. For example, tunneling element 12 may represent and be characteristic of the programming operation of a electron tunneling element in a memory cell, with this element comprising a first region P1, a dielectric gap 13, and a second region P2. In one embodiment, P1 may represent a programming electrode formed in a polysilicon layer in the integrated circuit, the dielectric gap 13 could be a conventional thickness of silicon dioxide or some other oxide dielectric, and P2 may represent a floating gate element also formed as part of a polysilicon layer. Electrons would then tunnel from P1 to P2 under the influence of voltage of sufficient magnitude coupled across said gap 13.

Similarly, tunneling element 14 may comprise two regions identified as P2 and P3, and a dielectric gap 15 formed between these regions. Thus, tunneling element 14 may represent and be characteristic of the erasing operation of a floating gate, with P2 representing the floating gate, a dielectric gap 15, and P3 representing an erase electrode. Electrons would then tunnel across the dielectric 15 to P3 from P2 again once a voltage of sufficient magnitude is coupled across said gap 15. These regions may also be formed from polysilicon layers as is known in the art.

To maximize the correspondence of tunneling elements 12 and 14 with tunneling elements in respective cells in the memory circuit, preferably the STORE pulse, which is fed to the cells to initiate tunneling, is also fed directly to these tunneling elements 12, 14 rather than some other voltage pulse. In one embodiment, wherein the STORE pulse is coupled through a capacitor to each of the memory cells, corresponding capacitors 16 and 20 are connected in series between the STORE pulse and respective tunneling elements 12 and 14. The ratio of these capacitors to their respective tunneling elements 12 and 14 are also chosen in such a way as to match the voltage characteristics which are typically found internally in said memory cell.

In operation, the high voltage pulse output from the charge pump circuit 4 is usually a ramp voltage of substantially constantly increasing amplitude that for the purposes of the present invention, extends in amplitude to a voltage above the maximum voltage anticipated as being needed as a STORE pulse. This is to enable the STORE pulse to be able to compensate for the substantial degradation of the tunneling mechanism over time as high numbers of tunneling cycles have been performed. As will become more apparent herein, the present invention limits the amplitude of the STORE voltage to that amount needed to efficiently produce electron tunneling but not so high as to overdrive the cell. Thus, for example, the circuit according to the present invention may output a STORE voltage of 32 volts when only a few tunneling cycles have been performed in the memory circuit, while a voltage of perhaps 45 volts may be needed after, for example, 100,000 cycles of tunneling have been performed.

As described in more detail below, the STORE voltage pulse is of substantially the same amplitude as the input high voltage pulse generated by the charge pump 4 until the STORE voltage pulse is clamped and limited to a preferred tunneling voltage as defined by the circuit according to the present invention. The STORE pulse is therefore initially an increasing voltage which starts as 0 volts and thereafter rises at some rate, typically such that it would reach 30 volts after about a millisecond.

This fairly slow rise time is due to the capacitive load that is being fed by the STORE pulse. In addition, such a low current capacitive load enables a charge pump as shown at 4 to be integrated on the same chip as the memory array or other tunneling circuit being powered by the pump 4, and to generate a high voltage pulse from the 5 volt logic level power source used by the other circuit elements on the chip.

Since the STORE voltage is coupled to tunneling elements 12 and 14 through capacitors 16 and 20, the voltage at nodes 18 and 22 between these respective elements also begins to rise. This is because tunneling elements 12 and 14 also act capacitively until electron tunneling begins. Such tunneling occurs when the voltage at nodes 18 and 22 reaches the minimum voltage required to induce tunneling across the respective dielectric gaps 13 and 15. Note that it is not necessary and in fact it is a purpose of this arrangement to detect if one of these two tunneling elements requires a higher voltage than the other element to induce such electron tunneling. Also, once tunneling occurs the corresponding node 18 or 22 voltage is substantially clamped to that tunneling voltage, and will not rise above that voltage, notwithstanding a further increase in the STORE pulse voltage amplitude on the other side respectively of capacitors 16 and 20.

In other words, this circuit arrangement provides means for sensing when one or more tunneling elements begins to tunnel electrons across a dielectric gap and creates a corresponding reference voltage at a node e.g. node 18 or 22, which represents the voltage needed to generate tunneling across that gap. This is beneficial, since it is anticipated that the tunneling characteristics across the oxide dielectric between a programming electrode and a floating gate may differ from the tunneling characteristics across the oxide dielectric between a floating gate and a corresponding erase electrode in a memory cell. What is needed is a circuit that compares these voltages, determine which was the highest voltage required to induce tunneling across a dielectric gap, and then output a voltage reference representing this worst case operation. The amplitude of the STORE pulse can be adjusted, as hereinafter described, to a voltage which enables the requisite tunneling to properly occur across all such dielectric gaps in a memory array.

It should also be understood here that when electron tunneling is described as having begun what is meant is that at this point a substantial number of electrons are tunneling across the dielectric gap. It has been found that at lower voltages "tunneling" of electrons does occur, but in such insignificant numbers so as to be essentially imperceptible as compared with what is generally regarded as being a tunneling effect.

The comparison means for detecting the highest level reference voltage generated by respective tunneling elements 12 and 14 operates as follows. The voltages at nodes 18 and 22 are fed to the gates of respective transistors 24 and 25 whose drains are tied in common to the high voltage pulse input to the circuit, the HV PULSE signal, and whose sources are tied in common to a node 26. The voltage on node 26 is termed the pedestal or reference voltage generated by the comparison means. In operation, the higher of the two voltages appearing at nodes 18 and 22 will enable a higher voltage to be coupled through a respective transistor 24, 25 from the high voltage pulse input thereto to node 26. The net voltage at node 26 is designed to be one threshold below this highest voltage. This threshold voltage, e.g. one or two volts, is due to the black bias effect between the gate of each transistor 24, 25 and the drain plus the intrinsic threshold of the device. For instance, if node 22 is at 20 volts, and is higher than the voltage on node 18, node 26 will typically be at 18 or 19 volts, presuming that the high voltage pulse appearing on the drain of transistors 24, 25 is higher than approximately 22 volts. Clearly, more stages of this type could be compared i.e. more transistors connected in parallel in the manner of transistors 24 and 25, and therefore any typical tunneling characteristics can be monitored in the same manner according to the present invention for detection of the worst case voltage required to initiate tunneling in a tunneling element.

The purpose of transistors 8 and 9, which are coupled respectively to nodes 18 and 22, is to simply precharge these nodes 18, 22 to a voltage that is one threshold below the power supply voltage coupled to the integrated circuit, Vcc. With nodes 18 and 22 at this voltage level, e.g. 4 volts when Vcc equals 5 volts, they cause respective transistors 24 and 25 to be "on", i.e. conductive between their source and drain, whether or not a high voltage pulse is being generated by the high voltage generator circuit 2. Note that since transistors 8 and 9 are connected in a diode configuration, nodes 18 and 22 are not prevented from rising beyond this 4 volt, minimum level once they are enable to do so in response to the increasing amplitude of the STORE pulse. As mentioned above, this pulse is coupled to nodes 18 and 22 by respective capacitors 16 and 20. One reason for maintaining transistors 24 and 25 on, even when the STORE voltage is unable to do so, is to provide a path to ground for the high voltage pulse via transistor 32 to discharge the high voltage signal, as hereinafter described.

The purpose of the voltage at node 26 is to provide a means for limiting the maximum output voltage of the STORE pulse independent of the ultimate voltage of the input high voltage pulse as generated by a charge pump 4 or some other high voltage generator. Assuming, for simplicity, that node 26 feeds directly to a node 46 and thereby to the gate of a depletion mode transistor 34. Transistor 34 is initially on at least in part since it is a depletion mode device. The high voltage pulse is connected to one side of transistor 34, and is thus fed through the device to a node 40. Also connected to node 40 is the gate of transistor 30 which is also a depletion mode transistor. With the high voltage fed to the gate of transistor 30, this enables the high voltage pulse, which is also connected to one side of transistor 30, to be passed through and output by transistor 30 as the STORE pulse. At this point the STORE pulse would have substantially the same amplitude as the high voltage input pulse.

Transistor 34 is critical to the operation of the present invention, since it functions to clamp the amplitude of the output STORE voltage at a voltage level as controlled by the voltage on node 46. The amplitude of the STORE voltage pulse is clamped at the point at which the output voltage at the output side of transistor 34 ceases to rise. A capacitor 42 is also connected to node 40 between transistor 34 and the gate of transistor 30. Capacitor 42 operates to hold sufficient charge so as to keep the gate of transistor 30 at a high voltage even if the voltage at node 46 drops and, as a result, transistor 34 goes off. As described below, capacitor 42 is designed to maintain the output voltage level of the STORE pulse through transistor 30 for at least a predetermined duration of time controlled by the flat top generator circuit 6. Note that in normal operation the high voltage pulse will continue to rise to a higher voltage amplitude after the STORE signal has been limited in its voltage amplitude by transistor 34.

The voltage at node 46 is clamped at the proper time in the following manner. Connected between node 26 and ground is a capacitor 44. This capacitor acts to reach a voltage as determined by the tunneling characteristics of one of the tunneling elements 12, 14 as described above. Once tunneling has begun, the voltage on node 26 is limited to this voltage. Assuming node 26 and node 46 were directly connected, this would cause transistor 34 to go off once the high voltage pulse increased in magnitude beyond the voltage at node 26 a threshold amount. As mentioned above, this causes the STORE output pulse to be limited to a voltage amplitude which is a function of the voltage on node 26.

However, means are also provided for generating a margin voltage to ensure that the STORE pulse amplitude rises a predetermined amount above the minimum voltage needed for tunneling to be begun. Thus, another transistor 57 is interposed between nodes 26 and 46. The gate of transistor 57 is fed from a node 56 which is fed from a capacitor chain comprising capacitors 52 and 54. Capacitor 52 is connected to the high voltage pulse input and capacitor 54 is tied to ground. Capacitor 52 and 54 act to enable a predetermined voltage level to be produced on node 56 as a function of the present level of the input high voltage pulse. Therefore, by choosing the capacitive ratio between capacitors 52 and 54, and thereby defining the voltage on node 56, means are provided for determining how much overdrive or voltage margin is generated in the STORE pulse amplitude as coupled to said memory cells. For example, if the tunneling voltage reference created at node 26 is 20 volts, capacitors 52 and 54 can be set to provide a predetermined voltage at node 56 such that transistor 57 goes on only after node 56 has risen beyond the voltage at node 26 by a threshold voltage. Thus, node 46 is enabled initially to rise to a higher voltage than node 26, with transistor 57 initially off, due to the operation of a capacitor 48 which is connected between node 46 and the high voltage input pulse. It is the voltage changes on node 46 that determine the limiting voltage level of the output STORE pulse. That is, the voltage change on node 46 acts to switch off transistor 34 thereby preventing any higher voltage from the high voltage pulse from passing to node 40 once transistor 57 goes on. Once transistor 57 goes on, node 46 is coupled to node 26 and the operation of capacitor 44 becomes dominant, thereby causing node 46 to drop in voltage to near the voltage at node 26. This causes transistor 34 to go off, preventing any further increase in voltage at node 40. This is because the high voltage pulse is no longer coupled through transistor 34 to node 40. With the voltage at node 40 sustained at a constant level due to the action of capacitor 42, transistor 30 is prevented from going on any harder, so that after this time the output STORE pulse is limited to a voltage reflected by the voltage on capacitor 42.

Also note that transistor 36 acts as a diode and transistor 38 acts as a gate to bias node 46 initially at a positive voltage to insure that transistor 34, even though it is a depletion mode device, is fully on from the beginning of the operation of the circuit 5, to enable the STORE pulse to be initially output as a voltage pulse of substantially the same magnitude as the input high voltage pulse.

As described above, also provided is a circuit 6 which functions to enable the STORE pulse to remain substantially at its maximum limited voltage level for a predetermined period of time after this voltage level has been reached. Thereafter, this circuit 6 provides means at the end of this predetermined period of time for resetting the entire circuit 2.

As previously mentioned, the advantage of maintaining the STORE voltage at some substantially constant level after tunneling has been initiated is to enable each tunneling element to have a full opportunity to couple as much charge as possible across the oxide from one region to another, e.g. from a programming electrode to a floating gate, without overstressing the oxide with a higher than necessary voltage. Such a higher voltage may cause more electrons to be trapped in the dielectric thereby reducing the lifetime of the tunneling element.

Specifically, the flat top circuit 6 is designed to enable the STORE pulse to be maintained at a substantially constant high voltage level for approximately one or two milliseconds. Circuit 6 performs this task by timing out at the end of this time interval and generating a high voltage end signal (H.V. END) at the end of this predetermined time interval. The operation of circuit 6 comprises sensing the rate of change of the voltage of the STORE pulse with respect to time, its dV/dT. This is sensed by coupling the STORE output pulse to a node 103 via capacitor 102. A current described below is also fed out of node 103 via gate 108. So long as the high voltage STORE pulse is in fact rising in amplitude, the current is substantially dominated by the current being fed to node 103 via capacitor 102 via dV/dT maintaining 103 at a positive voltage. Once the amplitude of the STORE pulse is limited, this dV/dT, the rate of change of the STORE amplitude, goes to approximately zero, and the circuit 6 timing function beings.

Transistor 108 is one half of a mirror circuit. When dV/dT ceases to maintain the voltage on node 103 via capacitor 104, the current passing through transistor 108, a very small current, eventually discharges the voltage on node 103. When the voltage at 103 is discharged, this enables transistor 106 to go off, thereby generating an output logic pulse identified as the high voltage end pulse via current source 100. As described in more detail below, transistor 106 is also off initially while the STORE pulse is below a certain minimum voltage, and node 103 is at an initial low voltage, but this race condition is prevented from causing a high voltage end pulse to be generated by means of a circuit 200. Transistor 104 merely functions to provide means for preventing node 103 from increasing in voltage beyond a predetermined point as dV/dT is maintained. In the present embodiment, by the operation of transistor 104, the maximum voltage at node 103 is one threshold voltage above the voltage of the logic level power supply, Vcc, e.g. 6 volts. Thus, transistor 104 acts to make the voltage of node 103 at the beginning of the timing interval substantially independent of the maximum STORE voltage level. Note, however, that so long as the STORE pulse is increasing in magnitude the voltage at node 103 is kept at the 6 volt level.

The size of capacitor 102 in combination with the node voltage 103 and the displacement current flowing through gate 108 determines the timing of the time out of circuit 6, and thus the time when the high voltage end pulse is generated. The difficulty with prior art devices has been the inability to easily create a current that is small enough to provide the length of time desired to create a one or two millisecond time constant in an integrated circuit. This is achieved in the present invention by using a reverse mirror circuit comprising transistors 110, 112 and node 114 which feeds the gate of transistor 108. The purpose of these transistors is to produce a voltage on node 114 which then drives the gate of transistor 108 so as to keep 108 just barely turned on, such that a small but well controlled current passes through transistor 108 from node 103. Transistors 110 and 112 are arranged as an inverter, and gate 112 is designed such that current flowing through this transistor is of a fixed predetermined amplitude. With these elements connected in the manner shown, the current through transistor 108 is controlled by the current flowing through transistor 112 factored down by a factor of 20-50 depending on the ratios chosen. Thus, for example, with a current of 1 microamp flowing through transistor 112, this would create a current of 25 nanoamps flowin through transistor 108. Such a circuit is beneficial in that it enables this small current level to be controlled with an accuracy approaching 20-30%. Consequently, with the maximum current through transistor 108 controlled, the length of time needed to discharge the voltage on node 103 is predetermined.

Note that one side of both transistors 108 and 112 is shown to be connected to the negative supply of the integrated circuit, e.g. generally $-4$ to $-5$ volts. These transistors could also be tied to ground, but the advantage of connecting them to $V_{BB}$ is that there is no body effect variation on the threshold.

Circuit 200 is provided as part of the flat top circuit 6 to screen out any H.V. END pulse that may be generated at the beginning of the high voltage STORE pulse generation cycle. In the absence of circuit 200, in the embodiment shown in circuit 6, the H.V. END pulse would also be high until node 103 had initially risen to a sufficient voltage amplitude to turn on transistor 106 and hold the H.V. END pulse at ground.

Circuit 200 includes a depletion mode transistor 202 and a gate transistor 204 connected in a invertor arrangement similar to that of transistors 110 and 112. The output of this circuit is coupled to the gate of transistor 206 which functions to hold the H.V. END pulse line at ground as a function of the voltage on the gate of transistor 206. Transistor 204 is a field device which operates to have a threshold amount much higher than the normal threshold of 1 or 2 volts. This is enabled by providing a thick field oxide layer between the gate and the channel region of transistor 204. As seen in FIG. 2, the on or off state of transistor 204 is controlled by the output STORE voltage, which is coupled to the gate of this transistor.

Therefore, in operation, transistor 204 is maintained off until the STORE voltage increases beyond 8 or 10 volts. Consequently, for this initial period, the gate of transistor 206 is high due to the action of transistor 202. This causes transistor 206 to be on, thereby grounding the H.V. END pulse during this period. Only after this initial period, when the STORE output pulse amplitude has increased beyond this 8-10 volt level, is the H.V. END signal line released and allowed to operate normally. As mentioned above, in normal operation, the H.V. END pulse does not go on until after the STORE output pulse has reached its maximum voltage level and the timing portion of circuit 6 has thereafter timed out. Time out occurs when node 103 has dropped to a voltage level sufficiently low to cause transistor 106 to turn off, enabling transistor 100 to cause the H.V. END pulse to go high.

To initiate the end portion of the high voltage pulse generation cycle, the H.V. END pulse may be fed to a latch circuit 300 which operates to output an $\overline{STL}$ pulse. The $\overline{STL}$ pulse acts to reset the high voltage generator system circuit 2, and thereby reinitialize the circuit to enable proper generation of the next requested high voltage pulse. As seen in FIG. 1, the latch 300 may be set by a logic level request pulse such as a H.V. PULSE SELECT IN pulse. This latter pulse may be generated either on the integrated circuit chip or external thereto, and may comprise a memory array chip select pulse, or the like. The output of latch 300 is the $\overline{STL}$ pulse. The $\overline{STL}$ pulse causes the entire circuit 2 to reset and reinitialize by gating ground potentials to various points in the circuit 2.

Specifically, the $\overline{STL}$ pulse is fed to the input lines $\Phi 1$ and $\Phi 2$ of the charge pump circuit 4 via transistors 302 and 304. When turned on by $\overline{STL}$, these transistors 302 and 304 ground the multiphase input clocks 101 1 and $\Phi2$. With $\Phi1$ and $\Phi2$ grounded, the charge pump 4 is prevented from operating. Similarly, as previously mentioned, the $\overline{STL}$ pulse is also input to transistor 32, and functions to ground node 26 at the end of the high voltage pulse generator cycle and thus to discharge capacitor 44. With node 26 held at ground, a path is also provided for discharging the H.V. PULSE to ground through transistors 24 and 25. As mentioned above, transistors 24 and 25 remain on to some extent even when the STORE pulse is not coupled to nodes 18 and 22, by means of transistors 8 and 9.

The $\overline{STL}$ pulse is also fed to transistor 306 in the regulator circuit 5, which functions to ground node 56. With node 56 grounded, capacitor 52 and 54 are discharged, thereby reinitializing this circuit for the next high voltage pulse generation cycle. Finally, the $\overline{STL}$ pulse is fed to the flat top circuit 6 via transistor 308, and causes node 103 to be clamped to ground.

In summary, the $\overline{STL}$ pulse causes the H.V. PULSE, and thereby the STORE pulse, the pedestal voltage of node 26, and the voltage at node 103 all to return to or be held at a low voltage. Because the load on the output STORE line may be large, some length of time may be required to enable the amplitude of the STORE pulse to return to a low voltage.

FIG. 2 illustrates a timing diagram of the embodiment of the present invention shown in the circuit diagram of FIG. 1. As seen in FIG. 2, the H.V. PULSE SELECT IN initialized the operation of the high voltage generator system by causing latch 300 in circuit 7 to change state causing the $\overline{STL}$ output signal to go low. With the output signal $\overline{STL}$ low, the above described transistors, transistors 32, 302, 304, 306, and 308 are caused to go off, enabling circuit operation to commence. Exemplary multiphase clock pulses $\Phi1$ and $\Phi2$ are shown to illustrate the general shape of pulses which may be input to the charge pump 4. It should be realized here that the illustrated time base of the H.V. PULSE SELECT, $\overline{STL}$ 101 1 and $\Phi2$ signals are not to scale, since these signals typically operate in the 5 HMz range, whereas the output H.V. PULSE, STORE, and other voltage levels of the circuit according to the present invention operate at much lower speeds, typically in the 1 to 2 millisecond range. With $\Phi1$ and $\Phi2$ coupling charge to the charge pump 4, the output H.V. PULSE signal begins to rise from 0 volts, as shown in FIG. 2, up to some maximum voltage depending on the amplitude of the $\Phi1$ and $\Phi2$ input signals and the number of stages in the charge pump 4 circuit. The present invention is operative with an H.V. PULSE whose amplitude is enabled to increase to some level above 32 volts, e.g. 40–50 volts. With the H.V. PULSE rising, the output STORE pulse also begins to rise, since initially the H.V. PULSE is fed out as the STORE pulse via transistor 30 in the regulator circuit 5. With the STORE voltage rising, this also causes the voltage at nodes 18 and 22 to rise, since the STORE pulse is fed to these nodes via respective capacitors 16 and 20. Also note initially that the voltage on node 26 follows the voltage on nodes 18 and 22 via transistors 24 and 25, while node 56 also begins to increase in voltage amplitude due to the operation of the capacitor chain 52 and 54 tied directly to the H.V. PULSE. Referring again to FIG. 2, node 18 and 22 are shown rising, respectively, to a level of 22 volts and 16 volts before tunneling begins across respective gaps in the dielectric of the tunneling elements 12 and 14. Once tunneling begins, the voltages at these nodes remain substantially constant, even though the STORE pulse continues to rise for a time, due to the fact that the tunneling element looks more like a conductor rather than a capacitor when electron tunneling is occurring. As described above, node 26 continues to rise in voltage until the higher of the two voltages at nodes 18 and 22 is reached. As seen, with node 18 at 22 volts, node 26 is at approximately 20 volts due to the threshold voltage drop across transistor 24. With node 26 now at a substantially constant voltage, equal to the reference voltage for this particular high voltage generation cycle, it is enabled to act on node 46 once transistor 57 goes on. Transistor 57 is controlled by the voltage on node 56. It is seen that this voltage on node 56 continues to rise until it reaches one voltage threshold above the voltage at node 26, a level of approximately 22 volts, at which time capacitor 44, which is tied to node 26, becomes dominant over the voltage on node 46 created by capacitor 48. As can be seen in the figure, when transistor 57 goes on, node 46 drops in voltage causing transistor 34 to go off. With transistor 34 off, node 40 no longer is enabled to increase in voltage as a function of the H.V. PULSE. Due to the operation of capacitor 42, the STORE pulse is also held at this point substantially to its present voltage of approximately 32 volts. Down at the bottom of FIG. 2, the operation of the flat top generator circuit 6 is also illustrated, with the voltage signal at node 103 being illustrated along with the timing of occurrence of the H.V. END pulse. Node 103 is enabled to begin to rise in voltage as a function of the rise in voltage of the STORE pulse once $\overline{STL}$ goes low and transistor 308 goes off. This continues until node 103 reaches approximately 6 volts, at which time transistor 104 takes over and limits node 103 at this 6 volt level. The voltage at node 103 remains at 6 volts due to the continued dV/dT of the STORE pulse that it is detected by capacitor 102, which results from the continued increasing in amplitude of the STORE pulse until transistor 34 goes off. Once transistor 34 goes off, node 103 is enabled to begin its discharge timing cycle, wherein current through transistor 108 slowly causes the voltage at node 103 to discharge. As described above, once the voltage in node 103 reaches a minimum value, e.g. 1.5 volts, this causes transistor 106 to go off and the H.V. END pulse to be generated. As mentioned above, the H.V. END then causes latch 300 to reset, with the effect that the $\overline{STL}$ pulse changes state. With the $\overline{STL}$ pulse now high, transistors 32, 302, 304, 306 and 308 are again caused to couple their respective nodes to ground which thereby resets the high voltage generating circuit 2 after some additional period of time, such a period of time is required to discharge these nodes. The result is that the high voltage pulse generator system is now reinitialized, and enabled to begin generation of the high voltage STORE pulse.

Although the invention has been described specifically with reference to a particular circuit embodiment which uses device parameters typical of a 5 volt n-channel MOS device and adapted to provide a specified STORE pulse of approximately 32 volts and a predetermined flat top time interval before the STORE pulse is removed, many variations, adaptions and modifications will become apparent from the present disclosure, and all are intended to be within the spirit and scope of the present invention as defined by the accompanying claims.

It is envisioned that the present invention is applicable to any integrated circuit device wherein electrons are tunneled across a dielectric, wherein the dielectric may be: a thick oxide in combination with asperities or other tunneling enhancing structure; a thin oxide of less than 50–100 Angstroms; a multiple layer dielectric; or an interelectrode gap of enriched polysilicon. Further, the regions between which tunneling is generated may comprise: a polysilicon layer; some type of semiconductor layer; or an MNOS type of region.

Various features of the invention are set forth in the following claims.

What is claimed is:

1. An integrated circuit device comprising:
   means responsive to a first voltage pulse of increasing magnitude for generating a store signal of substantially equal amplitude;
   means for capacitively coupling said store signal across a dielectric gap between a first region and a second region;
   means for sensing when said store signal has reached a minimum voltage level so as to cause electron tunneling to begin across said dielectric gap from said first region to said second region;
   means responsive to said sensing means for generating a reference voltage whose voltage amplitude reflects said minimum voltage level and;
   means responsive to the generation of said reference voltage for limiting said store signal to a predetermined voltage amplitude with respect to said reference voltage amplitude.

2. The integrated circuit device of claim 1 wherein said means for limiting said store signal amplitude includes;
   means for generating a margin voltage of a predetermined amplitude; and
   means for limiting said store signal to a voltage amplitude that is a predetermined function of the sum of said reference voltage amplitude and said margin voltage amplitude.

3. The integrated circuit device of claim 1 or 2 further comprising:
   means for maintaining said store signal substantially at said limited voltage level for a predetermined period of time after said voltage level has been reached; and
   means responsive to the end of said predetermined period of time for resetting said store signal generating means and said reference voltage generating means.

4. The integrated circuit device of claim 1 further comprising:
   means for sensing when said store signal has reached a minimum voltage level so as to cause electron tunneling to begin across one or more sets of additional dielectric gaps between respective first regions and second regions;
   means responsive to each said sensing means for generating corresponding reference voltages each of whose voltage level reflects said maximum voltage level when tunneling begins across its corresponding said dielectric gap;
   comparison means for detecting the highest level reference voltage generated by said means for generating said reference voltage; and
   wherein said means responsive to the generation of said reference voltage further comprises means for limiting said store signal to a predetermined voltage amplitude with respect to said highest level reference voltage.

5. In an integrated circuit device having a first region, a second region and a dielectric gap between said first and said second region, and wherein electron tunneling is induced across said dielectric gap from said first region to said second region in response to a tunneling voltage, the improvement comprising:
   means for generating said tunneling voltage whose amplitude is substantially equal to a first voltage of increasing amplitude so long as said electron tunneling has not been induced by said tunneling voltage across said dielectric gap, and whose amplitude is limited to a voltage level independent of the voltage level of said first voltage once said electron tunneling has been induced.

6. The device of claim 5 further comprising:
   means for maintaining said output voltage pulse substantially at said limited voltage amplitude for a predetermined period of time.

7. In a semiconductor integrated circuit memory including an array of nonvolatile electrically alterable memory cells, each cell including a floating gate conductor wherein charge is enabled to be tunneled between said floating gate and a second conductor across an oxide layer as a function of a tunneling voltage applied across said oxide layer, an improved apparatus for generating said tunneling voltage, wherein the improvement comprises:
   means for increasing the level of said tunneling voltage as the voltage level needed to produce tunneling increases with the number of tunneling cycles performed in said memory.

8. The apparatus of claim 7 further comprising:
   means for maintaining said tunneling voltage at said increased voltage level for a predetermined period of time.

9. In an integrated circuit device having a plurality of tunneling elements, each of said tunneling elements having a first region, a second region and a dielectric gap formed between said first region and said second region of each of said tunneling elements, an apparatus for generating a tunneling voltage signal for causing electrons to tunnel across each such dielectric gap comprising:
   means responsive to a first voltage pulse of increasing magnitude for causing said tunneling voltage signal to have substantially equal amplitude;
   means for capacitively coupling said tunneling voltage signal across each said dielectric gap between its respective first region and second region;
   means for sensing when said tunneling voltage signal has reached a minimum voltage level so as to cause electron tunneling to begin across each said dielectric gap;
   means responsive to said sensing means for comparing the voltage level at which each said dielectric gap is caused to have have electron tunneling begin and for generating a reference voltage reflecting the highest such voltage level; and
   means responsive to the generation of said reference voltage for limiting said tunneling voltage signal to a predetermined voltage amplitude with respect to said reference voltage amplitude.

10. The integrated circuit device of claim 9 further comprising means for generating said first voltage pulse, said means including charge pump means connected to the logic level power source of said integrated circuit and responsive to a multiphase clock signal for pumping charge packets along a plurality of discrete stages of increasing potential, said first voltage pulse being generated as an increasing voltage potential whose amplitude exceeds said power source potential and the voltage amplitude of said multiphase clock.

11. The integrated circuit device of claim 9 wherein said means for comparing each said dielectric tunneling voltage level comprises:
   a transistor associated with each said dielectric gap;
   means for coupling each said corresponding dielectric tunneling voltage level to the gate of the corresponding transistor associated with said dielectric gap; and
   means for connecting one side of each said transistor to a common point such that said common point has coupled to it the highest level tunneling voltage, said common point voltage level comprising said reference voltage.

12. The integrated circuit device of claim 9 further comprising:
   means for maintaining said tunneling voltage signal substantially at said limited voltage level for a predetermined period of time after said voltage level has been reached.

13. The integrated circuit device of claim 12 wherein said maintaining means comprises:
   reverse mirror means for generating a displacement current;
   capacitor means connected between said tunneling voltage signal and said reverse mirror means, such that so long as said tunneling voltage signal continues to increase in magnitude, said capacitor means remains charged, overriding the loss of charge resulting from the operation of said displacement current, said capacitor means of a value such that once said tunneling voltage signal has substantially ceased increasing in magnitude, said displacement current causes said capacitor means to discharge at a rate such that a minimum voltage is reached at the end of said predetermined period of time; and
   means for generating an end signal once said minimum voltage across said capacitor is reached.

14. The integrated circuit device of claim 13 wherein said maintaining means further comprises:
   means for limiting the maximum voltage across said capacitor means to a predetermined value below the ultimate value of said tunneling voltage signal, such that said capacitor means maximum voltage is independent of the final voltage amplitude of said tunneling voltage signal.

15. The integrated circuit device of claim 9 wherein said means for limiting said tunneling voltage signal comprises:
   capacitor means for toning an increasing charge as a function of the voltage level of said first voltage pulse; and
   means for gating said first voltage pulse under the control of said reference voltage, such that said first voltage pulse is coupled to said capacitor means only until said reference voltage is generated, said capacitor means thereafter having sufficient charge to maintain the voltage amplitude of said tunneling voltage signal at a substantially constant level.

16. The integrated circuit device of claim 15 wherein said means for gating said first voltage pulse gating means further comprises means for causing said first voltage pulse to be decoupled from said capacitor means only after a predetermined amount of charge reflecting an additional margin voltage has been coupled to said capacitor means.

* * * * *

UNITED STATES PATENT AND TRADEMARK OFFICE
CERTIFICATE OF CORRECTION

PATENT NO. : 4,404,475
DATED : September 13, 1983
INVENTOR(S) : Joseph Drori, William H. Owen and Richard T. Simko It is certified that error appears in the above-identified patent and that said Letters Patent are hereby corrected as shown below:

Column 1, line 63, change "an" to --a--.
Column 3, line 56, change "memoray" to --memory--.
Column 3, line 57, change "capactively" to --capacitively--.
Column 4, line 51, change "a" (first occurrence) to --an--.
Column 7, line 7, change "enable" to --enabled--.
Column 8, line 7, change "Capacitor" to --Capacitors--.
Column 9, line 17, change "beings" to --begins--.
Column 9, line 68, change "flowin " to --flowing--.
Column 10, line 10, change "$V_{BB}$" to -- $-V_{BB}$ --.
Column 10, line 21, change "a" (second occurrence" to --an--.
Column 11, line 15, change "capacitor" to --capacitors--.

UNITED STATES PATENT AND TRADEMARK OFFICE
CERTIFICATE OF CORRECTION

PATENT NO. : 4,404,475

DATED : September 13, 1983

INVENTOR(S) : Joseph Drori, William H. Owen and Richard T. Simko

It is certified that error appears in the above-identified patent and that said Letters Patent are hereby corrected as shown below:

Column 11, line 40, delete "101 1" and insert --$\phi$1--.

Column 11, line 64, change "node" to --nodes--.

Column 13, line 27, change "level and;" to --level; and--.

Column 13, lines 33-34, change "includes;" to --includes:--.

Column 14, line 58, delete "have" (second occurrence).

Signed and Sealed this

Twenty-fourth Day of April 1984

[SEAL]

Attest:

Attesting Officer

GERALD J. MOSSINGHOFF

Commissioner of Patents and Trademarks